United States Patent [19]
Telford et al.

[11] Patent Number: 6,090,706
[45] Date of Patent: *Jul. 18, 2000

[54] PRECONDITIONING PROCESS FOR TREATING DEPOSITION CHAMBER PRIOR TO DEPOSITION OF TUNGSTEN SILICIDE COATING ON ACTIVE SUBSTRATES THEREIN

[75] Inventors: Susan Weiher Telford, Untergruppenbach, Germany; Michio Aruga, Inba-gun, Japan; Mei Chang, Cupertino, Calif.

[73] Assignee: Applied Materials, Inc., Santa Clara, Calif.

[*] Notice: This patent is subject to a terminal disclaimer.

[21] Appl. No.: 09/140,818

[22] Filed: Aug. 26, 1998

Related U.S. Application Data

[60] Division of application No. 08/574,739, Dec. 19, 1995, abandoned, which is a continuation-in-part of application No. 08/504,294, Aug. 10, 1995, Pat. No. 5,510,297, which is a continuation of application No. 08/352,265, Dec. 7, 1994, abandoned, which is a continuation of application No. 08/083,420, Jun. 28, 1993, abandoned, which is a continuation-in-part of application No. 08/364,022, Dec. 23, 1994, Pat. No. 5,482,749, which is a continuation of application No. 08/138,179, Oct. 14, 1993, abandoned, which is a continuation-in-part of application No. 08/083,420, Jun. 28, 1993, abandoned.

[51] Int. Cl.[7] .................................................. H01L 21/44
[52] U.S. Cl. .......................... 438/680; 438/683; 438/906; 427/255.2
[58] Field of Search ....................................... 438/677, 680, 438/682, 683, 906; 427/578, 126.1, 237, 238, 239, 255.1, 255.2, 255.7

[56] References Cited

U.S. PATENT DOCUMENTS

| | | | |
|---|---|---|---|
| 4,684,542 | 8/1987 | Jasinski et al. | 438/680 |
| 4,692,343 | 9/1987 | Price et al. | 427/574 |

(List continued on next page.)

FOREIGN PATENT DOCUMENTS

| | | |
|---|---|---|
| 0134645 | 6/1984 | European Pat. Off. . |
| 0428733 | 4/1990 | European Pat. Off. . |
| 0648860 | 10/1994 | European Pat. Off. . |
| 63-293920 | 11/1988 | Japan . |
| 63-310956 | 12/1988 | Japan . |
| 1064324 | 3/1989 | Japan . |
| 3194948 | 8/1991 | Japan . |
| 9117839 | 11/1991 | WIPO . |

OTHER PUBLICATIONS

Gregory, Richard B., et al., "RBS and SIMS Characterization of Tungsten Silicide Deposited by Using Dichlorosilane and Tungsten Hexafluoride", Surface and Interface Analysis, vol. 14, 1989, pp. 13–17.

Wolf, S., et al. "Silicon Processing for the VLSI ERA" Process Technology., Lattice Press vol. 1, pp. 171–173, 1986.

*Primary Examiner*—T. N. Quach
*Attorney, Agent, or Firm*—Blakely Sokoloff Taylor & Zafman

[57] ABSTRACT

A process is disclosed for preconditioning surfaces of a tungsten silicide deposition chamber, after a previous step of cleaning the chamber, and prior to depositing tungsten silicide on active substrates in the chamber, which first comprises treating the chamber surfaces with a gaseous silicon source, such as silane, and a tungsten-bearing gas, such as $WF_6$, to form a first deposition of a silane-based tungsten silicide on the chamber surfaces. In a preferred embodiment, the preconditioning process further comprises subsequently treating the already coated chamber surfaces in a second step with a mixture of a tungsten-bearing gas, such as $WF_6$, and a chlorine-substituted silane such as dichlorosilane ($SiH_2Cl_2$), monochlorosilane ($SiH_3Cl$), or trichlorosilane ($SiHCl_3$) to form a chlorine-substituted silane-based tungsten silicide deposition over the previous deposited tungsten silicide, prior to commencement of depositing tungsten silicide on active substrates in the deposition chamber.

20 Claims, 1 Drawing Sheet

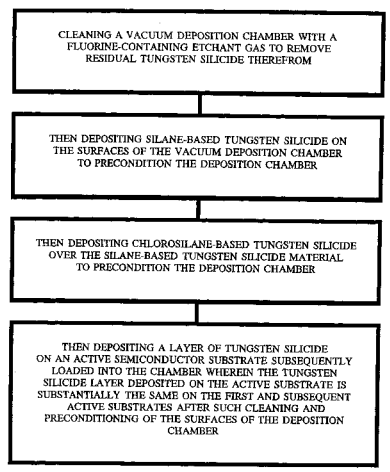

U.S. PATENT DOCUMENTS

| | | | |
|---|---|---|---|
| 4,785,962 | 11/1988 | Toshima | 220/260 |
| 4,851,295 | 7/1989 | Brors | 428/450 |
| 4,897,171 | 1/1990 | Ohmi | 204/298 |
| 4,966,869 | 10/1990 | Hillman et al. | 438/685 |
| 5,096,534 | 3/1992 | Ozias | 117/102 |
| 5,119,541 | 6/1992 | Ohmi et al. | 29/25.02 |
| 5,175,017 | 12/1992 | Kobayashi et al. | 427/8 |
| 5,180,432 | 1/1993 | Hansen | 118/697 |
| 5,203,956 | 4/1993 | Hansen | 216/63 |
| 5,207,836 | 5/1993 | Chang | 134/1 |
| 5,231,056 | 7/1993 | Sandhu | 438/654 |
| 5,273,588 | 12/1993 | Foster et al. | 118/723 |
| 5,314,509 | 5/1994 | Kato et al. | 34/406 |
| 5,482,749 | 1/1996 | Telford et al. | 427/578 |
| 5,510,297 | 4/1996 | Telford et al. | 438/683 |
| 5,817,576 | 10/1998 | Tseng et al. | 438/680 |

```
┌─────────────────────────────────────────────────────────┐
│                                                         │
│     CLEANING A VACUUM DEPOSITION CHAMBER WITH A         │
│     FLUORINE-CONTAINING ETCHANT GAS TO REMOVE           │
│        RESIDUAL TUNGSTEN SILICIDE THEREFROM             │
│                                                         │
└─────────────────────────────────────────────────────────┘
                             │
┌─────────────────────────────────────────────────────────┐
│                                                         │
│    THEN DEPOSITING SILANE-BASED TUNGSTEN SILICIDE ON    │
│      THE SURFACES OF THE VACUUM DEPOSITION CHAMBER      │
│         TO PRECONDITION THE DEPOSITION CHAMBER          │
│                                                         │
└─────────────────────────────────────────────────────────┘
                             │
┌─────────────────────────────────────────────────────────┐
│                                                         │
│  THEN DEPOSITING CHLOROSILANE-BASED TUNGSTEN SILICIDE   │
│     OVER THE SILANE-BASED TUNGSTEN SILICIDE MATERIAL    │
│         TO PRECONDITION THE DEPOSITION CHAMBER          │
│                                                         │
└─────────────────────────────────────────────────────────┘
                             │
┌─────────────────────────────────────────────────────────┐
│                                                         │
│         THEN DEPOSITING A LAYER OF TUNGSTEN SILICIDE    │
│     ON AN ACTIVE SEMICONDUCTOR SUBSTRATE SUBSEQUENTLY   │
│       LOADED INTO THE CHAMBER WHEREIN THE TUNGSTEN      │
│      SILICIDE LAYER DEPOSITED ON THE ACTIVE SUBSTRATE IS│
│    SUBSTANTIALLY THE SAME ON THE FIRST AND SUBSEQUENT   │
│         ACTIVE SUBSTRATES AFTER SUCH CLEANING AND       │
│    PRECONDITIONING OF THE SURFACES OF THE DEPOSITION    │
│                          CHAMBER                        │
│                                                         │
└─────────────────────────────────────────────────────────┘
```

PRECONDITIONING PROCESS FOR TREATING DEPOSITION CHAMBER PRIOR TO DEPOSITION OF TUNGSTEN SILICIDE COATING ON ACTIVE SUBSTRATES THEREIN

CROSS-REFERENCE TO RELATED APPLICATIONS

This application is a divisional of Telford et. al., Ser. No. 08/574,739, filed Dec. 19, 1995 abandoned, which is a continuation-in-part of Telford et al. Ser. No. 08/504,294, filed Aug. 10, 1995 U.S. Pat. No. 5,510,297, which is a continuation of Telford et al. Ser. No. 08/352,265, filed Dec. 7, 1994 abandoned, which is a continuation of Telford et al. Ser. No. 08/083,420 filed Jun. 28, 1993 abandoned, and all assigned to the assignee of this application. This application is also a continuation-in-part of Telford et al. Ser. No. 08/364,022, filed Dec. 23, 1994 U.S. Pat. No. 5,482,749, which is a continuation of Telford et al. Ser. No. 08/138,179, filed Oct. 14, 1993 abandoned, which is a continuation-in-part of Telford et al. Ser. No. 08/083,420 filed Jun. 28, 1993, abandoned, and all assigned to the assigned of this application.

BACKGROUND OF THE INVENTION

1. Field of the Invention

This invention relates to a preconditioning process for a deposition chamber for the deposition of tungsten silicide on an active substrate. More particularly, this invention relates to a preconditioning process for treating surfaces of a deposition chamber, after a cleaning step and prior to deposition of tungsten silicide on an active substrate therein.

2. Description of the Related Art

In the deposition of a material such as a tungsten silicide on a substrate, residues from the deposition process, e.g., tungsten silicide residues, may also be deposited on the surfaces of the deposition chamber, including the chamber walls and the susceptor used to support the substrate in the deposition chamber. Repeated tungsten silicide depositions results in the buildup of such undesirable residues on the deposition chamber surfaces. To prevent such residues from flaking off the chamber surfaces, which would result in contamination of the substrate being processed in the chamber, the chamber is subject to periodic cleaning to remove such deposition residues. The removal of such tungsten silicide residues from the deposition chamber surface may be accomplished by the use of a fluorine-containing etchant such as $NF_3$, or $C_2F_6$, $CHF_3$.

Normally, but not necessarily, the cleaning of the chamber is performed using a plasma in conjunction with such fluorine-containing etchant gases and may be followed by a passivation treatment with hydrogen to remove fluorine-bearing residues remaining in the chamber. However, in the subsequent deposition of tungsten silicide on an active substrate or wafer in the deposition chamber, after such a cleaning treatment, it has been found that the initial active substrate subsequently mounted on the susceptor is not adequately receptive to the deposition of a layer of tungsten silicide.

Thus, the tungsten silicide, deposited on the initial or first active substrate processed after cleaning, is of inferior quality and must be rejected. This, of course, is not only a rejection or loss of the cost of the tungsten silicide layer but also is a rejection or loss of any other structure previously formed on the active substrate, e.g., an integrated circuit structure created to that point on a semiconductor wafer. It will then be seen that the loss is not insubstantial. If the vacuum chamber is cleaned, for example, after every tenth wafer treated with tungsten silicide, the number of wafer rejected can amount to ten percent.

This problem is most apparent when a combination of a tungsten-bearing gas such as $WF_6$ is used in connection with a chlorine-substituted silane gas such as dichlorosilane (DCS). Since the formation of a tungsten silicide layer using a chlorine-substituted silane gas has been found to provide step coverage over an uneven substrate surface superior to the use of silane itself, it is particularly important that a way be found to periodically clean the deposition chamber to remove undesired deposition residues without, however, interfering with subsequent depositions of tungsten silicide on active substrates, and in particular, without incurring the inferior deposition of tungsten silicide on the first or initial active substrate processed after such a cleaning of the vacuum chamber.

In our parent applications, Telford et al. Ser. Nos. 08/504, 294, 08/352,265, and 08/083,420, we addressed this problem by proposing a pretreatment or conditioning to be carried out on an aluminum nitride surface of the susceptor in the deposition chamber after each cleaning operation, and prior to the processing of the first substrate after such a cleaning step. In particular, we taught a preconditioning treatment in which, after the cleaning of the deposition chamber, a deposition of tungsten silicide was carried out in the chamber, prior to mounting an active substrate on the susceptor, and using a combination of a tungsten-bearing gas such as $WF_6$; a chlorine-substituted silane gaseous silicon source such as, for example, dichlorosilane ($SiH_2Cl_2$), monochlorosilane ($SiH_3Cl$), or trichlorosilane ($SiHCl_3$); and a carrier gas, such as argon or helium, i.e., the same gases used to form the desired tungsten silicide coating on substrate subsequently processed in the deposition chamber.

While this precoating or preconditioning procedure, as described and claimed in those parent applications, resulted in the subsequent formation of a satisfactory coating of tungsten silicide on even the first active substrate subsequently processed in the chamber after a cleaning step and this preconditioning step, it was found that in some instances, particularly when a chlorosilane was used in the preconditioning treatment, subsequent deposits on active substrates, e.g., after the processing of 10 or more active substrates, resulted in the eventual build up of residues on the chamber surfaces, including the susceptor surfaces, which tended to more readily flake off and form particles than previously deposited residues on the chamber surfaces.

We addressed this second problem, in our parent applications Telford et al. Ser. Nos. 08/364,022 and 08/138,179, by proposing that the preconditioning be carried out on the surfaces of the cleaned deposited chamber, including the susceptor, in a two step process carried out after each cleaning operation, and prior to the processing of the first active substrate after such a cleaning step. The two-step process described and claimed in parent Ser. Nos. 08/364, 022 and 08/138,179 comprised first preconditioning the chamber surfaces with a mixture of a non-chlorinated silane and a tungsten-bearing gas, such as $WF_6$, to form a first deposition of a silane-based tungsten silicide and then treating the already coated surfaces of the chamber in a second step with a mixture of a tungsten-bearing gas, such as $WF_6$, and a chlorine-substituted silane, such as dichlorosilane ($SiH_2Cl_2$), monochlorosilane ($SiH_3Cl$), or trichlorosilane ($SiHCl_3$), to form a chlorine-substituted silane-based tungsten silicide deposition over the previous deposited silane-based tungsten silicide.

SUMMARY OF THE INVENTION

Our invention is also directed to a process for addressing the problem of the formation of an inferior tungsten silicide coating, on the first active substrate processed in a chamber after the chamber has been cleaned, in a manner which will also inhibit the subsequent formation of particles in the chamber due to flaking off of residues deposited on the chamber surfaces.

In accordance with the invention, a deposition chamber is preconditioned, after a previous step of cleaning the chamber, and prior to depositing tungsten silicide on active substrates in the chamber, in a process which comprises treating the chamber with a mixture of silane and a tungsten-bearing gas, such as $WF_6$, to form a deposition of a silane-based tungsten silicide. In a preferred embodiment, the process includes the above step as well as a further step of subsequently treating the already coated surfaces of the chamber with a mixture of a tungsten-bearing gas, such as $WF_6$, and a chlorine-substituted silane such as dichlorosilane ($SiH_2Cl_2$), monochlorosilane ($SiH_3Cl$), or trichlorosilane ($SiHCl_3$) to form a chlorine-substituted silane-based tungsten silicide deposition over the previous deposited silane-based tungsten silicide.

BRIEF DESCRIPTION OF THE DRAWINGS

The sole drawing is a flowsheet of the preferred embodiment of the process of the invention.

DETAILED DESCRIPTION OF THE INVENTION

The invention solves the problem of the formation of an inferior tungsten silicide coating, on the first active substrate processed in a chamber after the deposition chamber has been cleaned, by a pretreatment process which also preferably inhibits the subsequent formation of particles in the chamber due to flaking off of residues deposited on the chamber surfaces during the processing of active substrates therein.

In accordance with the invention, a deposition chamber is preconditioned, after a previous step of cleaning the chamber, in a process which, in one embodiment, comprises treating the chamber surfaces with a mixture of silane and a tungsten-bearing gas, such as $WF_6$, to form a first deposition of a silane-based tungsten silicide. In another embodiment, the preconditioning process comprises treating the chamber surfaces with a mixture of silane and a tungsten-bearing gas, such as $WF_6$, to form a first deposition of a silane-based tungsten silicide, as in the previous embodiment, and then treating the already coated aluminum-bearing surfaces of the chamber in a second step with a mixture of a tungsten-bearing gas, such as $WF_6$, and a chlorine-substituted silane such as dichlorosilane ($SiH_2Cl_2$), monochlorosilane ($SiH_3Cl$), or trichlorosilane ($SiHCl_3$) to form a chlorine-substituted silane-based tungsten silicide deposition over the previous deposited tungsten silicide.

The term "active substrate" as used herein is intended to define a substrate on which a tungsten silicide layer is deposited during the course of the regular processing of substrates having other integrated circuit structures already formed thereon, and is not intended to include, but rather exclude, so-called "dummy substrates", i.e., substrates such as silicon wafers which do not have useful structure already formed thereon, but which might be used during the preconditioning process merely to provide a discardable substrate on the susceptor during the preconditioning treatment step or steps, and then removed from the chamber prior to commencement of processing of the "active substrate" in the chamber after the preconditioning process.

While it is not our intent to be bound by any theories, it is now believed that the preconditioning or pretreating process of the invention provides a residue of process gases and/or deposition materials in the chamber, after a previous cleaning step or steps, which is somehow beneficial to the satisfactory formation of a tungsten silicide layer on the first active substrate subsequently processed in the chamber after such cleaning and preconditioning of the chamber.

Formation of the Silane-Based Tungsten Silicide Deposit

The silane-based first tungsten silicide material to be deposited on surfaces of the deposition chamber to precondition the chamber, may be applied in any way that provides a silane-based tungsten silicide coating on the deposition chamber surfaces. In a preferred embodiment, the tungsten silicide deposit may be applied or deposited on chamber surfaces, including at least a portion of the susceptor surfaces, by a CVD process wherein, for example, a mixture of a tungsten-bearing gas, a silane gas, and an optional carrier gas, is flowed into the chamber. The silane-based tungsten silicide material may also be applied to the chamber surfaces by a plasma enhanced chemical vapor deposition (PECVD) process.

When chemical vapor deposition is used, a gaseous mixture, for example, of a tungsten-bearing gas, such as $WF_6$ gas; silane gas ($SiH_4$); and a carrier gas, such as argon or helium, may be flowed into the vacuum chamber, for example, at flow rates which may comprise from about 1 to about 10 standard cubic centimeters per minute (sccm) for $WF_6$, preferably from about 1 to about 5 sccm, with a typical rate being about 2 sccm; and a flow rate of silane of from about 10 to about 100 sccm, with a preferred rate being in the range of from about 25 to about 75 sccm, with a typical rate being about 50 sccm. Larger or smaller flow rates may be used, if desired, depending upon the size of the chamber. The optional carrier gas in the mixture, preferably argon or helium, may be flowed into the chamber at a rate of from about 200 to about 1000 sccm, preferably at a rate in the range of from about 300 to about 700 sccm, with a typical rate being about 500 sccm. It should be noted that while the use of silane as the non-chlorinated gaseous source of silicon is preferred during this step, the use of other nonchlorinated gaseous sources of silicon, such as, for example, disilane ($Si_2H_6$), should be deemed to be within the scope of the invention. Therefore, it will be understood that the use of the term "silane-based tungsten silicide" is not intended to limit this embodiment of the process to only the use of silane gas.

During the silane-based tungsten silicide deposition, the susceptor, i.e., the substrate support plate, preferably should be maintained in a temperature range of from about 300° C. to about 700° C., preferably from about 425° C. to about 600° C., with a typical temperature being about 475° C.

With respect to pressure during the silane-based tungsten silicide deposition process, the vacuum chamber should be maintained at a pressure in the range of from about 0.1 Torr (100 milliTorr) to about 2 Torr, with a preferred range being from about 250 milliTorr to about 1250 milliTorr, with a typical pressure being about 500 milliTorr. Pressures lower than about 100 milliTorr could be used, but are deemed to be wasteful of process gas, while the use of pressure higher than about 2 Torr may give rise to gas phase reactions.

While we do not wish to be bound by any particular theories of how the deposition chamber becomes conditioned, it is believed that satisfactory conditioning of the chamber (taking into account pressure, flow rates of the conditioning gases, time, and chamber volume) may be measured or expressed as deposition thickness of the tungsten silicide layer or layers deposited on surfaces of the deposition chamber, including susceptor surfaces. The thickness believed to be needed for satisfactory conditioning of the chamber, when using a silane-based gas as the source of silicon, should be in an amount ranging from about 200 Angstroms to about 1500 Angstroms, with a preferably thickness being in the range of from about 800 Angstroms to about 1200 Angstroms, typically about 1000 Angstroms. The minimum amounts recited above are believed to represent the minimum amounts needed to provide the desired residue of process gases in the chamber after the preconditioning process, when the above-described single step preconditioning is carried out, while the maximum recited thickness of about 1500 Angstroms represents a thickness beyond which, while useful, is not deemed to be economical.

It should be noted that even when the described silane-based tungsten silicide pretreatment deposit is formed over the chamber surfaces prior to the subsequent formation of a chlorosilane-based tungsten silicide deposition on the chamber surfaces, i.e., a two step process as will be described below, the thickness of the silane-based tungsten silicide still should be at least about 200 Angstroms, because a silane-based tungsten silicide layer thinner than about 200 Angstroms is not deemed to be sufficiently thick to provide the desired stress relief or absorption for subsequently deposited chlorosilane-based tungsten silicide.

While the use of a CVD process to form the silane-based tungsten silicide layer is preferred, the silane-based tungsten silicide may also be applied to the chamber surfaces using a plasma assisted deposition, wherein, for example, a typical range of power utilized for the plasma may vary from about 25 to about 75 watts, with a typical amount of power being about 50 watts. The power range also may vary with chamber size.

A vacuum deposition chamber suitable for use in accordance with the present invention may comprise any commercially available chemical vapor deposition equipment capable of being operated in accordance with the invention. Such chamber should include a susceptor on which the substrate will rest in the chamber or reactor during subsequent processing of the substrate. An example of equipment which may be used in the practice of the invention comprises the Precision 5000 multi-chamber deposition and etching system available from Applied Materials, Inc., Santa Clara, Calif. A suitable multi-chambered apparatus is described in U.S. Pat. No. 4,785,962, the disclosure of which is hereby incorporated by references.

Satisfactory results may be obtained if only the above-described first silane-based tungsten silicide deposit is formed on the cleaned aluminum-bearing surfaces prior to the DCS-based tungsten silicide deposit on the first wafer thereafter processed. In such an instance, however, it may be advisable to use a "dummy substrate" or wafer for the first subsequent deposit of chlorosilane-based tungsten silicide on a substrate, to avoid risking the formation of an inferior coating of tungsten silicide on the first active substrate processed after the chamber cleaning and preconditioning operations.

Formation of the Silane-Based Tungsten Silicide Deposit

In the second embodiment of the invention, after formation of the nonchlorinated silane-based tungsten silicide material on the deposition chamber surfaces in the deposition chamber, a second tungsten silicide deposit may be formed over the first tungsten silicide deposit. The second tungsten silicide deposit comprises a chlorosilane-based tungsten silicide deposit, which is formed over the silane-based tungsten silicide material. The presence of the layer of chlorosilane-based tungsten silicide over the first tungsten silicide deposit on the chamber surfaces is thought to better provide the desired preconditioning of the chamber so that the first substrate subsequently processed therein to form a chlorosilane-based tungsten silicide layer on the substrate, e.g., a DCS-based tungsten silicide layer on the substrate, will have a satisfactory coating deposited thereon. By use of the term "chlorosilane" herein is meant a chlorine-substituted silane such as dichlorosilane ($SiH_2Cl_2$), monochlorosilane ($SiH_3Cl$), and trichlorosilane ($SiHCl_3$).

The chlorosilane-based tungsten silicide deposit to be formed over the silane-based tungsten silicide material, already deposited on the chamber surfaces, may be applied in any way that provides a second tungsten silicide coating over the previously formed tungsten silicide material. For example, the chlorosilane-based tungsten silicide deposit may be applied or deposited on the previously coated chamber surfaces by a CVD process wherein, for example, a mixture of $WF_6$ and $SiH_2Cl_2$ gases and a carrier gas such as argon or helium is flowed into the chamber. The chlorosilane-bearing tungsten silicide deposit may also be applied by a plasma enhanced chemical vapor deposition (PECVD) process.

When chemical vapor deposition is used, a gaseous mixture comprising, for example, $WF_6$ gas; a chlorosilane silicon gas source such as, for example, a dichlorosilane ($SiH_2Cl_2$), monochlorosilane ($SiH_3Cl$), or trichlorosilane ($SiHCl_3$) silicon source; and a carrier gas, such as argon or helium, may be flowed into the vacuum chamber. It should be noted that disilane ($Si_2H_6$) and/or silane ($SiH_4$) may be used with the chlorosilane as a supplemental source of silicon and/or as a reaction initiator in this step. The flow rates may comprise, for example, a rate of about 2 to 10 standard cubic centimeters per minutes (sccm) for $WF_6$, preferably from about 3 to about 6 sccm, with a typical rate being about 4 sccm; and a flow rate of chlorosilane-based silicon-containing gas such as dichlorosilane ($SiH_2Cl_2$) of from about 50 to about 400 sccm, with a preferred rate being in the range of from about 100 to about 300 sccm, with a typical rate being about 150 sccm. An optional supplemental flow of disilane and/or silane into the chamber may be at a rate of from 0 sccm to about 500 sccm, preferably from 0 to about 200 sccm. The carrier gas in the mixture, preferably argon or helium, is flowed into the chamber at a rate of from about 200 to about 1000 sccm, preferably at a rate in the range of from about 300 to about 700 sccm, with a typical rate being about 500 sccm.

During this second tungsten silicide deposition, the susceptor, i.e., the substrate support plate, should be maintained in a temperature range of from about 500° C. to about 700° C., preferably from about 525° C. to about 650° C., with a typical temperature being about 550° C. It should be noted, however, that due to the coolants circulated, respectively, adjacent the deposition chamber walls and lid, these surfaces will be considerably cooler during the deposition e.g., a wall temperatures of about 45° C. and a lid temperature of about 10° C.

With respect to pressure during the second deposition process, the vacuum chamber should be maintained at a pressure in the range of from about 0.5 Torr to about 10 Torr, with a preferred range being from about 1 Torr to about 5 Torr, with a typical pressure being about 2 Torr.

The thickness of the chlorosilane-based tungsten silicide material deposited on surfaces of the chamber is again used as an indicator of a conditioning of the chamber sufficient to enable acceptable subsequent deposition of a tungsten silicide layer on the first substrate subsequently processed after the cleaning and two step deposition or pretreatment of the invention. It has been found that to achieve this, the thickness of the chlorosilane-based tungsten silicide material deposited on the silane-based tungsten silicide-coated aluminum-bearing surfaces in the chamber should range from about 200 Angstroms to about 1000 Angstroms, with thicker deposits being useful, but unnecessary.

When the chlorosilane-based upper tungsten silicide deposit is formed using a plasma assisted deposition, a typical range of power utilized for the plasma may vary from about 25 to about 75 watts, with a typical amount of power being about 50 watts, with the actual amount of power used again depending upon the chamber volume. Further, when plasma assisted CVD is used, the above described gas mixture of $WF_6$, dichlorosilane, and carrier gas is preferably flowed into the chamber at a rate of from about 0.5 to about 8.5 sccm for $WF_6$, with a typical rate being about 4.5 sccm; and from about 50 to about 250 sccm for the chlorine-based silane gas such as $SiH_2Cl_2$ (dichlorosilane), with a typical rate being about 100 sccm. A carrier gas, such as argon, is not used with the plasma to avoid sputtering the walls of the chamber.

The following examples will serve to further illustrate the invention.

EXAMPLE I

To illustrate the prior art practice of depositing tungsten silicide on a wafer directly after cleaning of the chamber, a reaction chamber utilizing equipment therein, having aluminum-bearing surfaces therein, including a susceptor with an aluminum nitride surface, was used to deposit a series of tungsten silicide layers on integrated circuit structures on semiconductor wafers.

After processing about 25 wafers at a temperature of 550° C., the chamber surfaces were cleaned using a $NF_3$ plasma to remove buildup of tungsten silicide from the inside surfaces of the reactor. After cleaning, a wafer was mounted on a susceptor having an aluminum nitride surface, and (without precoating the susceptor or other aluminum-bearing surface of the chamber) a tungsten silicide layer was deposited on the wafer using a gas mixture comprising $WF_6$, which was flowed into the chamber at 4 sccm; dichlorosilane ($SiHCl_2$), which was flowed into the chamber at 150 sccm; and argon is a carrier gas, which was flowed into the chamber at 500 sccm. The susceptor was maintained at a temperature of about 550° C., and the chamber has a pressure of about 3 Torr during the deposition.

The coated wafer was removed from the chamber and examined. The tungsten silicide was found to be inferior because the resistivity of the coating was about 700 $\mu\Omega$ cm, i.e., about 100 $\mu\Omega$ cm below the desired resistivity (more tungsten-rich). Such low resistivity coatings of tungsten silicide have been found to delaminate in post processing. The tungsten silicide coating was also found to be less uniform or homogeneous in resistivity value across the wafer; i.e., the resistivity was found to vary by as much as 5% across the wafer, when a resistivity variation of not more than 3% is desirable.

EXAMPLE II

The procedure explained above in Example I was again repeated except that after the chamber was cleaned, as described above, and prior to placing a wafer on the susceptor, tungsten silicide material was deposited on the aluminum-bearing surfaces in the chamber under the same conditions as described above with respect to deposition on the wafer, i.e., using $WF_6$, $SiH_2Cl_2$ (DCS), and a carrier gas. Thereafter, a first wafer was placed on the coated susceptor support plate, and a DCS-based tungsten silicide layer was deposited on the wafer under the same conditions as for the deposition on the wafer in Example I after the cleaning step. The coated wafer was removed and examined and found to have a uniform layer of tungsten silicide deposited thereon of about 2500 Angstroms thickness. The resistivity of the resultant tungsten silicide layer on the wafer was found to be about 800 $\mu\Omega$ cm, with less than a 3% variation in resistivity in the coating across the wafer.

A second wafer was then mounted on the tungsten silicide coated susceptor, and tungsten silicide was deposited under the same conditions as noted with respect to the last wafer. This second wafer was then also removed and examined, and the tungsten silicide coating was found to have the same quality coating as on the previous wafer, i.e., a resistivity of about 800 $\mu\Omega$ cm, and less than a 3% variation in resistivity in the coating across the wafer.

However, after about 10 wafers were processed in the chamber, it was noted that some particle formation had occurred, which was believed to be due to fracture of the stressed DCS-based tungsten silicide deposits or residues on the chamber surfaces from underlying aluminum-bearing surfaces, and/or aluminum fluoride ($AlF_x$) surfaces formed on the aluminum-bearing surfaces, of the chamber from fluorine residues left in the chamber from the cleaning step.

EXAMPLE III

The procedure explained above in Example I was again repeated except that, in accordance with the invention, after the chamber was cleaned, as described above, and prior to placing a wafer on the susceptor, a 1000 Angstrom thick deposit of silane-based tungsten silicide was formed on the aluminum-bearing surfaces in the chamber, including the surface of the susceptor, by flowing into the chamber a gas mixture comprising $WF_6$, which was flowed into the chamber at about 2 sccm; silane ($SiH_4$), which was flowed into the chamber at about 50 sccm; and argon as a carrier gas, which was flowed into the chamber at about 500 sccm. The susceptor temperature was maintained at about 475° C., and the chamber was maintained at a pressure of about 500 milliTorr during the deposition.

Thereafter, a first wafer was placed on the coated susceptor support plate, and a DCS-based tungsten silicide layer was deposited on the wafer under the same conditions as for the deposition on the wafer in Example I after the cleaning step. The coated wafer was removed and examined and found to have a uniform layer of tungsten silicide deposited thereon of about 2500 Angstroms thickness. The resistivity of the resultant tungsten silicide layer on the wafer was found to be about 800 $\mu\Omega$ cm, with less than a 3% variation in resistivity in the coating across the wafer.

EXAMPLE IV

The procedure of Example III was repeated, except that after depositing the 1000 Angstroms thick silane-based tungsten silicide material on the aluminum-bearing surfaces in the chambers, DCS-based tungsten silicide material was deposited over the silane-based first tungsten silicide deposit. The dichlorosilane-based tungsten silicide material was deposited by flowing into the chamber 4 sccm of $WF_6$;

150 sccm of dichlorosilane; and 500 sccm of argon as a carrier gas. The susceptor was maintained at a temperature of about 550° C., and the chamber had a pressure of about 3 Torr during the dichlorosilane-based tungsten silicide deposition.

Thereafter, a first wafer was again placed on the coated susceptor support plate, and a tungsten silicide layer was deposited on the wafer under the same conditions as for the deposition on the wafer in Example I after the cleaning step. The coated wafer was removed and examined and found to have a uniform layer of tungsten silicide deposited thereon of about 500 Angstrom thickness. The resistivity of the resultant tungsten silicide layer on the wafer was found to be about 800 $\mu\Omega$ cm, with less than a 3% variation in resistivity in the coating across the wafer. A second wafer was similarly processed and tested, and found to yield similar results.

Further tungsten silicide depositions of DCS-based tungsten silicide were carried out on 25 more wafers, while the chamber was monitored for the presence of particles, indicative of flaking off of tungsten silicide residues deposited on the aluminum-bearing surfaces of the chamber during the depositions. No particles were observed in the chamber during the processing of the 25 wafers.

Similar results were obtained by modifying the process to include the use of plasma enhanced chemical vapor deposition of the dichlorosilane-based tungsten silicide. The conditions were the same as for the chemical vapor deposition except that the power was maintained at 25 watts, $WF_6$ was flowed at 4.5 sccm, and dichlorosilane was flowed in at a rate of 150 sccm, and no carrier gas was used to avoid sputtering the reactor chamber walls. Similar results may also be obtained if the silane-based tungsten silicide coating is also deposited by a plasma-assisted CVD process.

Thus, it will be seen that the described treatment, in accordance with the invention, of the deposition chamber surfaces, including surfaces such as a susceptor with an aluminum nitride surface thereon, enables the production of integrated circuit structures on semiconductor wafers, and in particular the deposition of a layer of tungsten silicide thereon, on a reproducible basis, regardless of periodic cleaning of the chamber, while also inhibiting the formation of particles in the chamber.

Having thus described the invention what is claimed is:

1. A process for preconditioning the surfaces of a deposition chamber, after a prior cleaning step, for the subsequent deposition of tungsten silicide on an active substrate therein which comprises:
   a) forming a first tungsten silicide deposit, having a thickness of at least about 200 Angstroms, on said surfaces of said deposition chamber by flowing into said chamber gases comprising $WF_6$ gas, non-chlorinated silane-based gas, and an optional carrier gas; and
   b) then forming a second tungsten silicide deposit, having a thickness of at least about 200 Angstroms, over said first tungsten silicide deposit by flowing into said chamber gases comprising $WF_6$ gas, an optional carrier gas, and a chlorine-substituted silane gas selected from the group consisting of dichlorosilane ($SiH_2Cl_2$), monochlorosilane ($SiH_3Cl$), and trichlorosilane ($SiHCl_3$).

2. The process of claim 1 wherein at least said step of forming said first tungsten silicide deposit is carried out in the presence of a dummy substrate on a susceptor in said deposition chamber.

3. A process for preconditioning the surfaces of a deposition chamber for the subsequent deposition of tungsten silicide on an active substrate therein, after a prior cleaning of said surfaces of said deposition chamber, comprising:
   forming a first tungsten silicide deposit on said surfaces of said deposition chamber by flowing into said deposition chamber gases comprising a gaseous source of tungsten and a non-chlorinated silane based-gas; and
   forming a second tungsten silicide deposit over said first tungsten silicide deposit on said surfaces of said deposition chamber by flowing into said chamber gases comprising a gaseous source of tungsten and a chlorine-substituted silane gas.

4. The process of claim 3 wherein said chlorine-substituted silane gas comprises dichlorosilane.

5. The process of claim 3 wherein said step of forming said second tungsten silicide deposit further comprises flowing a carrier gas into said chamber with said gaseous source of tungsten and said chlorine-substituted silane gas.

6. The process of claim 3 wherein said step of forming said second tungsten silicide deposit further comprises maintaining a plasma in said chamber while flowing said gaseous source of tungsten and said chlorine-substituted silane gas into said chamber.

7. The process of claim 3 wherein said step of forming said second tungsten silicide deposit over said first tungsten silicide deposit comprises flowing into said chamber a chlorine-substituted silane gas selected from the group consisting of dichlorosilane, monochlorosilane, and trichlorosilane.

8. The process of claim 3 wherein said step of forming said second tungsten silicide deposit over said first tungsten silicide deposit further comprises flowing into said chamber a non-chlorinated silane-based gas.

9. The process of claim 3 wherein said first tungsten silicide deposit is carried out until a thickness of at least about 200 Angstroms has been formed over said chamber surfaces.

10. The process of claim 3 wherein said first tungsten silicide deposit is carried out until a thickness of at least about 800 Angstroms has been formed over said chamber surfaces.

11. The process of claim 3 wherein said gaseous source of tungsten comprises $WF_6$.

12. The process of claim 3 wherein said step of forming said first tungsten silicide deposit further comprises flowing a carrier gas into said chamber with said gaseous source of tungsten and said non-chlorinated silane-based gas.

13. The process of claim 3 wherein said step of forming said first tungsten silicide deposit further comprises maintaining a plasma in said chamber while flowing said gaseous source of tungsten and said non-chlorinated silane-based gas into said chamber.

14. The process of claim 3 wherein said process is carried out in the presence of a dummy substrate on a susceptor in said deposition chamber.

15. The process of claim 3 wherein said flowing into said deposition chamber said gaseous source of tungsten to form said first tungsten silicide deposit occurs at a flow rate of 1 to about 5 standard cubic centimeters per minute.

16. The process of claim 3 wherein said flowing into said deposition chamber said non-chlorinated silane-based gas to form said first tungsten silicide deposit occurs at a flow rate of about 25 to about 75 standard cubic centimeters per minute.

17. The process of claim 12 wherein said flowing into said deposition chamber said carrier gas to form said first tungsten silicide deposit occurs at a flow rate of about 300 to about 700 standard cubic centimeters per minute.

18. The process of claim 3 wherein said flowing into said deposition chamber said gaseous source of tungsten to form said second tungsten silicide deposit over said first tungsten silicide deposit occurs at a flow rate of about 3 to about 6 standard cubic centimeters per minute.

19. The process of claim 3 wherein said flowing into said deposition chamber said chlorine-substituted silane gas to form said second tungsten silicide deposit over said first tungsten silicide deposit occurs at a flow rate of about 100 to about 300 standard cubic centimeters per minute.

20. The process of claim 8 wherein said flowing into said deposition chamber said non-chlorinated silane-based gas to form said second tungsten silicide deposit over said first tungsten silicide deposit occurs at a flow rate of 0 to about 200 standard cubic centimeters per minute.

* * * * *